United States Patent
Pillarisetty et al.

(10) Patent No.: US 11,171,233 B2
(45) Date of Patent: Nov. 9, 2021

(54) VERTICAL FIELD EFFECT TRANSISTORS (VFETS) WITH SELF-ALIGNED WORDLINES

(71) Applicant: Intel Corporation, Santa Clara, CA (US)

(72) Inventors: Ravi Pillarisetty, Portland, OR (US); Abhishek A. Sharma, Hillsboro, OR (US); Van H. Le, Beaverton, OR (US); Gilbert Dewey, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 16/490,502

(22) PCT Filed: Mar. 31, 2017

(86) PCT No.: PCT/US2017/025446
§ 371 (c)(1),
(2) Date: Aug. 30, 2019

(87) PCT Pub. No.: WO2018/182699
PCT Pub. Date: Oct. 4, 2018

(65) Prior Publication Data
US 2020/0020805 A1 Jan. 16, 2020

(51) Int. Cl.
*H01L 29/78* (2006.01)
*H01L 29/51* (2006.01)
*H01L 29/66* (2006.01)

(52) U.S. Cl.
CPC ........ *H01L 29/7827* (2013.01); *H01L 29/517* (2013.01); *H01L 29/66666* (2013.01)

(58) Field of Classification Search
CPC ............... H01L 29/7827; H01L 29/517; H01L 29/66666; H01L 29/4236
See application file for complete search history.

(56) References Cited

U.S. PATENT DOCUMENTS 5,102,817 A * 4/1992 Chatterjee ......... H01L 27/10841
257/E27.096
5,240,450 A * 8/1993 Graham ................. A63H 33/30
434/11

(Continued)

OTHER PUBLICATIONS

International Preliminary Report on Patentability from PCT/US2017/025446 dated Oct. 10, 2019.

(Continued)

*Primary Examiner* — Robert G Bachner
(74) *Attorney, Agent, or Firm* — Green, Howard & Mughal LLP

(57) ABSTRACT

Disclosed are systems, methods, and apparatus directed to the fabrication of vertical field effect transistors (VFETs) and VFETs with self-aligned wordlines. In one embodiment, the source and/or drain of the VFETs can include n-doped silicon. In one embodiment, the VFETs can include a channel that can be made of intrinsic silicon. In one embodiment, the source, drain, and/or channel can be deposited using physical vapor deposition (PVD), chemical vapor deposition (CVD), molecular beam chemical vapor deposition (MOCVD), and/or atomic layer deposition (ALD), and the like. In one embodiment, an STI process can be used to fabricate one or more recesses, which can reach the drains of the VFETs. In one embodiment, the systems, methods, and apparatus can permit the self-alignment of one or more wordlines of the VFETs with the one or more fins, and/or gate metals and gate materials of the VFETs.

25 Claims, 7 Drawing Sheets

(56) References Cited

U.S. PATENT DOCUMENTS

| | | | | | |
|---|---|---|---|---|---|
| 5,250,450 | A | * | 10/1993 | Lee | H01L 27/10864 |
| | | | | | 257/327 |
| 5,739,567 | A | * | 4/1998 | Wong | G11C 11/5621 |
| | | | | | 257/316 |
| 2005/0045969 | A1 | * | 3/2005 | Lee | H01L 29/165 |
| | | | | | 257/410 |
| 2013/0082308 | A1 | * | 4/2013 | Cheng | H01L 29/66636 |
| | | | | | 257/288 |
| 2013/0126954 | A1 | * | 5/2013 | Wu | H01L 27/10823 |
| | | | | | 257/296 |

OTHER PUBLICATIONS

International Search Report & Written Opinion dated Dec. 28, 2017 for PCT Patent Application No. PCT/US2017/025446.

* cited by examiner

VERTICAL FIELD EFFECT TRANSISTORS (VFETS) WITH SELF-ALIGNED WORDLINES

CLAIM OF PRIORITY

This Application is a National Stage Entry of, and claims priority to, PCT Application No. PCT/US2017/025446, filed on Mar. 31, 2017 and titled "VERTICAL FIELD EFFECT TRANSISTORS (VFETS) WITH SELF-ALIGNED WORDLINES", which is incorporated by reference in its entirety for all purposes.

TECHNICAL FIELD

This disclosure generally relates to vertical field effect transistors (VFETs).

BACKGROUND

Transistors can refer to semiconductor devices used to amplify or switch electronic signals and electrical power. Planar transistors can have a transistor density that can be increased, for example, by decreasing the pitch between transistor gate elements. However, with planar transistors, the ability to decrease gate pitch may be limited by the required gate length and/or spacer thickness. In recent years, research and development has targeted vertical transistor structures, for example, vertical field effect transistors (VFETs), which can decouple the gate length from the gate pitch, and thereby permit the scaling of transistor density. Accordingly, a VFET can refer to a field-effect transistor in which the current between the drain and source electrodes is primarily normal to the top surface of the die on which the VFET is fabricated.

BRIEF DESCRIPTION OF THE FIGURES

Reference will now be made to the accompanying drawings, which are not necessarily drawn to scale, and wherein.

DETAILED DESCRIPTION

Figure 1:
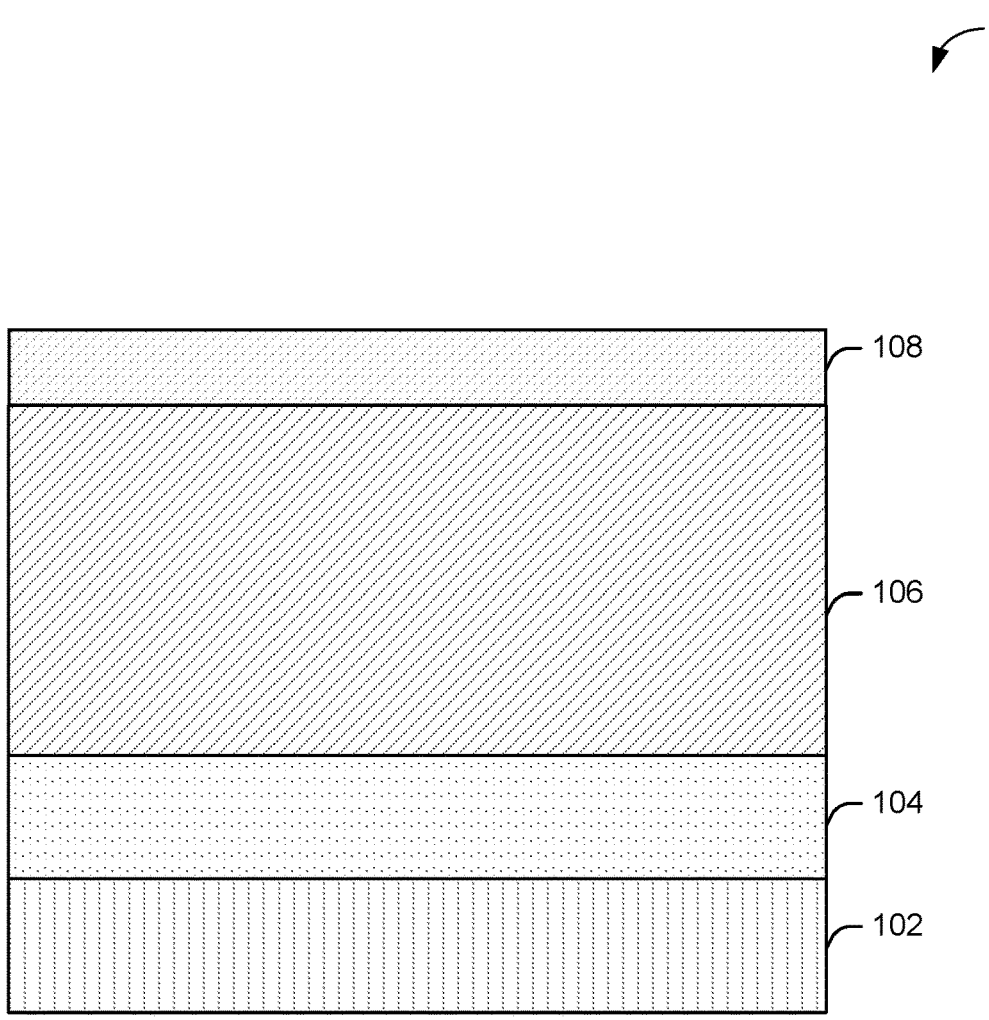
FIG. 1 shows a diagram that represents a partial structure of an intermediate step in the fabrication of a vertical field effect transistor (VFET) device in accordance with one or more example embodiments of the disclosure.
Figure 1:
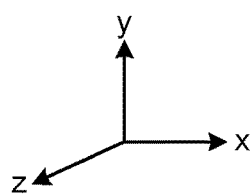

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in formation a described structure.

In one embodiment, disclosed herein are systems, methods, and apparatus directed to the fabrication of vertical field effect transistors (VFETs) and VFETs with self-aligned wordlines. In various embodiments, a VFET can refer to a field-effect transistor in which the current between the drain and source electrodes is primarily normal to the top surface of the die on which it is fabricated.

In one embodiment, wordlines can refer to one or more rows in VFET array, whereas the columns in the VFET array can be referred to as bit-lines. In one embodiment, the worldliness can connect the gates of VFETs in a certain row in an array of VFETs. Thus, when activating or deactivating a wordline (that is, increasing or decreasing the voltage on or from the wordline), the transistors which are on the row of a given wordline of the array, can open or close.

In one embodiment, the source of the VFET can include silicon. In another embodiment, the silicon material may be n-doped. In another embodiment, the source can be fabricated using epitaxy. In another embodiment, the source can be fabricated using molecular beam epitaxy (MBE).

In one embodiment, the VFET can include a channel that can be made of silicon. In another embodiment, the channel can include an intrinsic silicon. In one embodiment, the channel can be deposited using MBE.

In one embodiment, the VFET can include a drain. In one embodiment, the drain can be deposited using a mask. In one embodiment, the drain can include silicon. In another embodiment, the silicon material may be n-doped. In another embodiment, the drain can be fabricated using MBE.

In one embodiment, the device can include an oxide. In another embodiment, the oxide can include an interlayer dielectric (ILD) material. In another embodiment, ILD can include silicon dioxide ($SiO_2$), or a low-K material. In one embodiment, the oxide can be deposited using physical vapor deposition (PVD), chemical vapor deposition (CVD), molecular beam chemical vapor deposition (MOCVD), and/or atomic layer deposition (ALD), and the like.

In another embodiment, one or more trenches (also referred to as spacers and/or spacer fins herein) can be fabricated, for example, using a short trench recess process (STR) process to pattern the oxide. In one embodiment, a hard mask may be used in connection with the fabrication of the trenches and/or spacer fins.

In one embodiment, an STI process can be used to fabricate one or more recesses, which can reach the drains of the VFETs. In one embodiment, the systems, methods, and apparatus can permit the self-alignment of one or more wordlines of the VFET with the one or more fins, and/or gate metals and gate materials of the VFET. In one embodiment, the one or more wordlines can be independently electrically isolated from one another, without any further patterning and/or alignment steps in the fabrication of the VFET, thereby permitting and/or facilitating the scaling up of the VFETs.

In one embodiment, the recesses can be filled with a gate material. In one embodiment, the gate material can include a high-K dielectric material. In another embodiment, the gate material can include a high-K material, for example, hafnium oxide, tantalum oxide, and/or titanium oxide, aluminum oxide, silicon dioxide, silicon nitride and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, and/or ALD.

In one embodiment, a gate can be deposited on the gate material. In another embodiment, the gate can include a metal. In another embodiment, the gate can include a transition metal. In one embodiment, the gate can be used to tune the threshold voltage of the device. In one embodiment, the gate can include titanium nitride, cobalt, tungsten and/or platinum. In one embodiment, the gate can be deposited using PVD, CVD, MOCVD, and/or ALD.

FIG. 1 shows a diagram 100 that represents a partial structure of an intermediate step in the fabrication of a vertical FET device (herein also referred to as device) in accordance with one or more example embodiments of the disclosure. In an embodiment, the device can include a substrate 102. In one embodiment, the substrate 102 can refer to a solid (usually planar) substance onto which a layer of another substance is applied, and to which that second substance adheres. In one embodiment, the substrate can be a thin slice of material such as silicon, silicon oxide, silicon dioxide, aluminum oxide, sapphire, germanium, gallium arsenide (GaAs), an alloy of silicon and germanium, and/or indium phosphide (InP), and the like.

In one embodiment, the device can include a source 104. In one embodiment, the source 104 can include silicon. In another embodiment, the silicon material may be n-doped. In another embodiment, the source 104 can be fabricated using MBE. In another embodiment, the source 104 can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the source 104. In one embodiment, source 104 can include gettering materials. In one embodiment, the gettering materials can getter sulfur. In one embodiment, the source 104 can be doped, for example, by creating vacancies of sulfur and selenium. In another embodiment, the source 104 can be approximately 1 nanometer to approximately 75 nm thick (x and/or y dimensions), with example thicknesses of approximately 20 nm to approximately 30 nm thick (x and/or y dimensions). In one embodiment, the source 104 can be deposited using PVD, CVD, MOCVD, MBE, and/or ALD.

In one embodiment, the device can further include a channel 106. In one embodiment, the channel 106 can include silicon. In another embodiment, the channel 106 can include intrinsic silicon. In one embodiment, the channel 106 can be deposited using MBE. In one embodiment, the channel 106 can include black phosphorous, amorphous silicon, germanium, carbon nanotube, and the like. In one embodiment, the channel 106 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel length in the y-dimension and/or width in the x-dimension can depend on which technology is used to generate the transistor. In another embodiment, the channel 106 can be approximately 20 nm to approximately 200 nm long (in the y-dimension), with example thicknesses of approximately 60 nm to approximately 80 nm long (in the y-dimension). In one embodiment, the channel width can be approximately 90 nm down to approximately 5 nm (in the x-dimension). In one embodiment, the channel 106 can be deposited using PVD, CVD, MOCVD, MBE, and/or ALD, and the like.

In one embodiment, the device 100 can include a drain 108. In one embodiment, the drain 108 can be deposited using a mask. In one embodiment, the drain 108 can include silicon. In one embodiment, the silicon material may be n-doped. In another embodiment, the drain 108 can be fabricated using MBE. In another embodiment, the drain 108 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 108. In one embodiment, the drain 108 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 108 can have a thickness of approximately 0.5 nm to approximately 100 nm (in the x or y dimensions), with example thicknesses of approximately 0.5 nm to approximately 20 nm (in the x or y dimensions). In one embodiment, the drain 108 can be deposited using PVD, CVD, MOCVD, MBE, and/or ALD, and the like. In one embodiment, the source 104 and drain 108 can include the same material, except that the source 104 can be treated to remove some of the sulfur and/or selenium.

Figure 2:
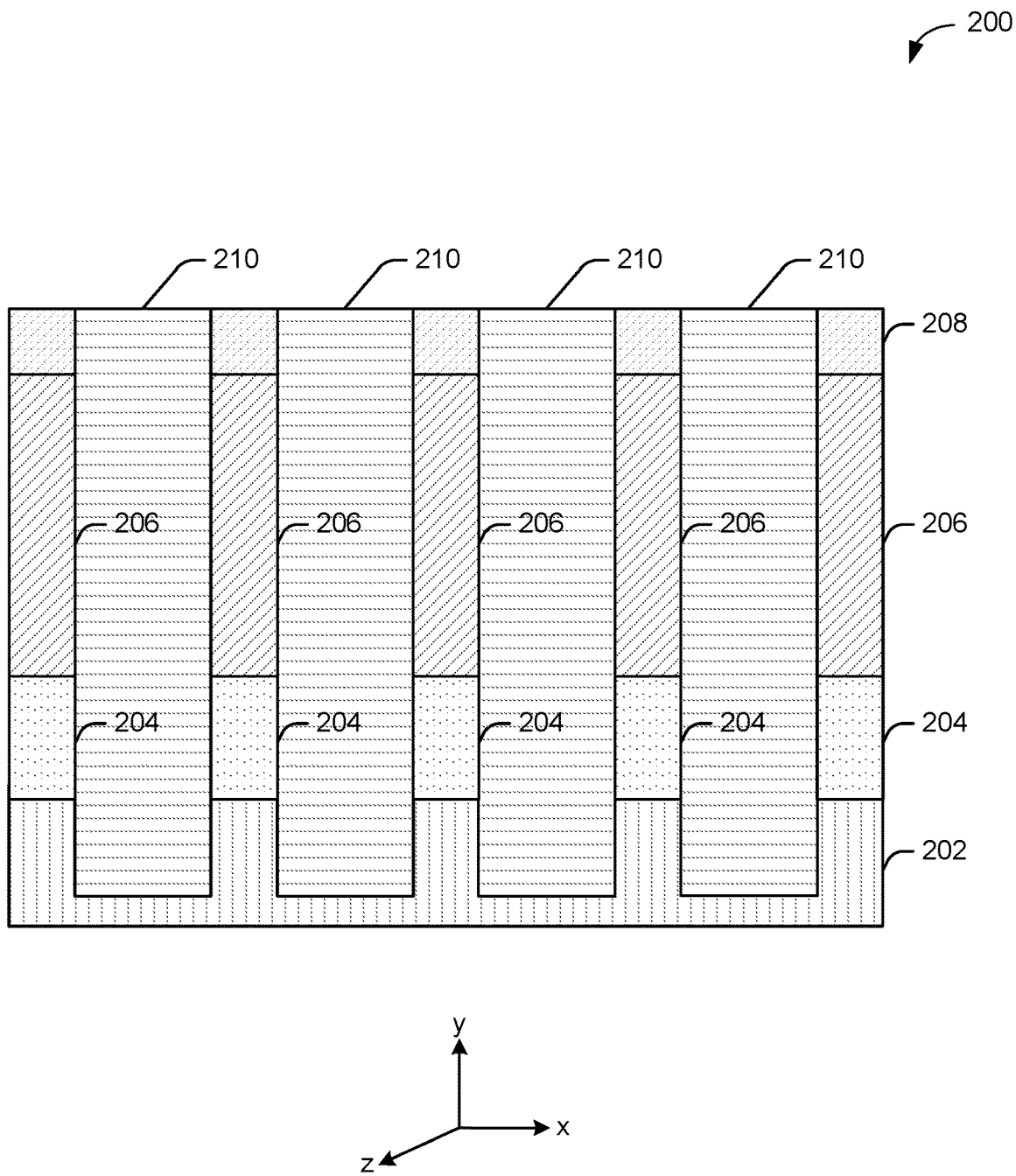
FIG. 2 shows another diagram representing a partial structure of an intermediate step in the fabrication of the VFET device, in accordance with one or more example embodiments of the disclosure.

FIG. 2 shows a diagram 200 representing a partial structure of an intermediate step in the fabrication of the vertical FET device, in accordance with one or more example embodiments of the disclosure. In an embodiment, the device can include a substrate 202. In one embodiment, the substrate 202 can refer to a solid (usually planar) substance onto which a layer of another substance is applied, and to which that second substance adheres. In one embodiment, the substrate can be a thin slice of material such as silicon, silicon oxide, silicon dioxide, aluminum oxide, sapphire, germanium, gallium arsenide (GaAs), an alloy of silicon and germanium, and/or indium phosphide (InP), and the like.

In one embodiment, the device can include a source 204. In one embodiment, the source 204 can include silicon. In another embodiment, the silicon material may be n-doped. In another embodiment, the source 204 can be fabricated using MBE. In another embodiment, the source 204 can include doped or undoped black phosphorous, titanium, tantalum, cobalt, molybdenum, titanium nitride, tantalum nitride, hafnium, copper, gadolinium, and the like. In one embodiment, the source 204 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 204. In one embodiment, source can include gettering materials. In one embodiment, the gettering materials can getter sulfur. In one embodiment, the source 204 can be doped, for example, by creating vacancies of sulfur and selenium. In one embodiment, the source 204 can be doped with oxygen vacancies if the source comprises an oxide or a multi-material system. In another embodiment, the source can be doped with phosphorous, boron, aluminum, tin, hafnium, titanium, copper, indium, and/or arsenic if the source 204 comprises a non-oxide a single-material semiconductor. In another embodiment, the source 204 can be approximately 1 nanometer to approximately 75 nm thick (x and/or y dimensions), with example thicknesses of approximately 20 nm to approximately 30 nm thick (x and/or y dimensions). In one embodiment, the source 204 can be deposited using PVD, CVD, MOCVD, MBE, and/or ALD, and the like.

In one embodiment, the device can further include a channel 206. In one embodiment, the channel 206 can include silicon. In another embodiment, the channel 106 can include intrinsic silicon. In one embodiment, the channel 206 can be deposited using MBE. In another embodiment, the channel 206 can include black phosphorous, amorphous silicon, germanium, carbon nanotube, and the like. In one embodiment, the channel 206 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on the technology used to generate the transistor. In another embodiment, the channel 206 can be approximately 20 nm to approximately 200 nm long (in the y-dimension), with example thicknesses of approximately 60 nm to approximately 80 nm long (in the y-dimension). In one embodiment, the channel width can be approximately 200 nm down to approximately 5 nm (in the x-dimension). In one embodiment, the channel 206 can be deposited using PVD, CVD, MOCVD, MBE, and/or ALD, and the like.

In one embodiment, the device 200 can include a drain 208. In one embodiment, the drain 208 can be deposited using a mask. In one embodiment, the drain 208 can include silicon. In another embodiment, the silicon material may be n-doped. In another embodiment, the drain 208 can be fabricated using MBE. In another embodiment, the drain 208 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain 208. In one embodiment, the drain 208 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain 208 can have a thickness of approximately 0.5 nm to approximately 100 nm (in the x or y dimensions), with example thicknesses of approximately 0.5 nm to approximately 20 nm (in the x or y dimensions). In one embodiment, the drain 208 can be deposited using PVD, CVD, MOCVD, MBE, and/or ALD, and the like. In one embodiment, the source 204 and drain 208 can include the same material, except that the source 204 can be treated to remove some of the sulfur and/or selenium.

In one embodiment, the device 200 can include an oxide 210. In another embodiment, the oxide 210 can include an interlayer dielectric (ILD) material. In another embodiment, the ILD can include silicon dioxide, $SiO_2$, or a low-K material. In one embodiment, the oxide 210 can be deposited using PVD, CVD, MOCVD, MBE, and/or ALD, and the like. In one embodiment, the oxide 210 can be fabricated as follows: initially, a trench (also referred to as a spacer and/or a spacer fin herein) can be etched, for example, using a short trench recess process (STR); next, the trenches can be filled with an oxide material such as the oxide 210 using, for example, PVD, CVD, MBE, MOCVD, and/or ALD, and the like; additionally, the oxide can be polished, for example, with a mechanical polishing step, until the level of the oxide in the z-dimension is made flush with the level of the drain 208, in the z-direction. In one embodiment, the oxide 210 can be approximately 10 nm to approximately 200 nm wide (in the x-dimension). In another embodiment, the oxide 210 can be approximately 10 nm long to approximately 200 nm long (in the y-dimension).

Figure 3:
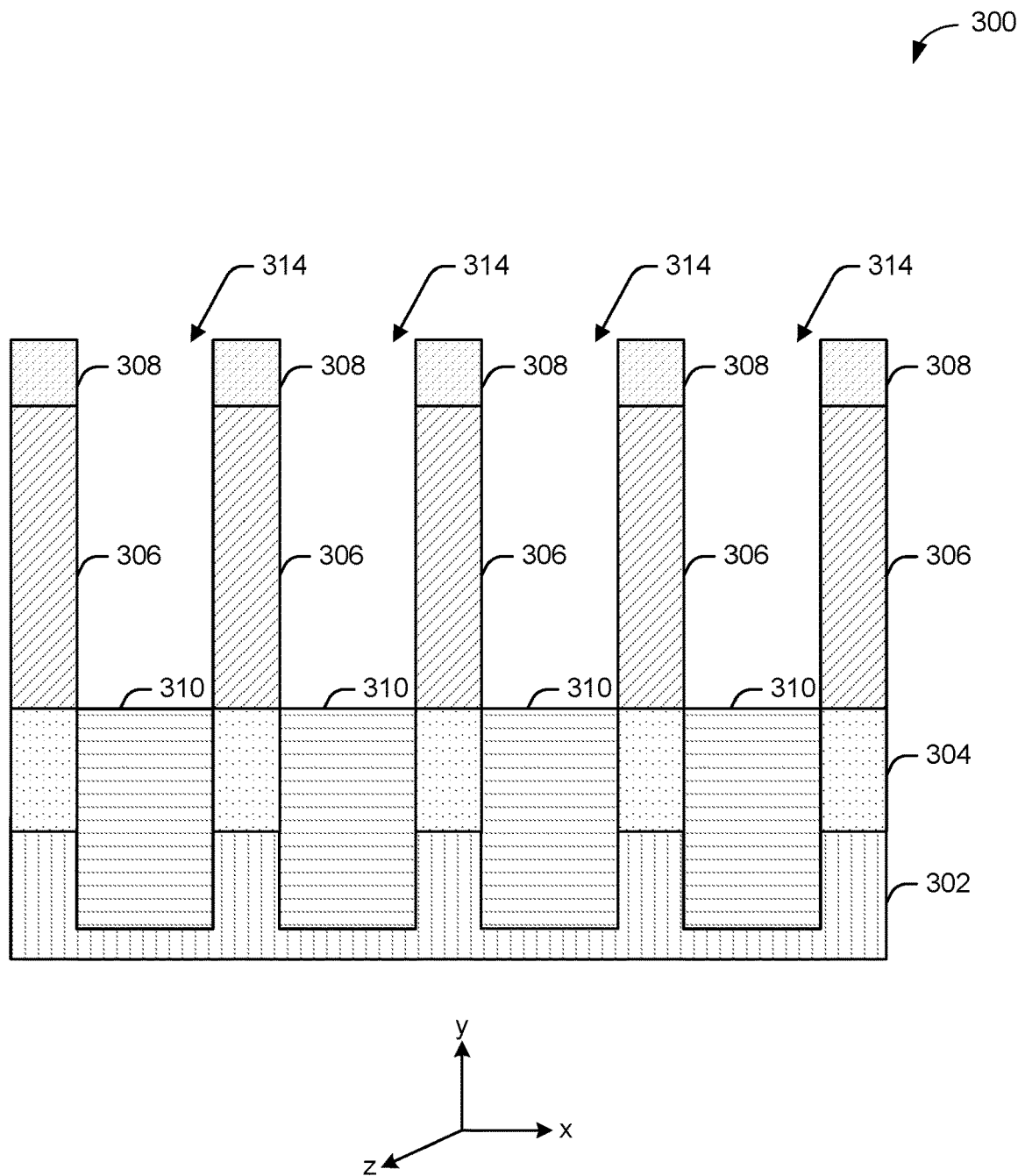
FIG. 3 shows another diagram representing a partial structure of an intermediate step in the fabrication of the VFET device, in accordance with one or more example embodiments of the disclosure.

FIG. 3 shows a diagram 300 representing a partial structure of an intermediate step in the fabrication of the vertical FET device, in accordance with one or more example embodiments of the disclosure. In one embodiment, a shallow trench isolation (STI) process can be used to etch the oxide 210 of FIG. 2 to yield an intermediate structure (not shown) used in the generation of the structure shown in FIG. 3. In particular, the STI process can be used to etch the oxide 210 to generate recesses 314. In another embodiment, the recesses 314 can have a width of approximately 10 nm to approximately 150 nm (x-dimension). In another embodiment, the recesses 314 can have a length of approximately 10 nm to approximately 150 nm (y-dimension). In one embodiment, the recesses 314 can be slightly over-etched in the y-dimension with respect to the level of the source 304.

In one embodiment, STI can refer to an integrated processing step. Some steps of the STI process can involve etching a pattern of trenches, depositing one or more dielectric materials and/or oxides to fill the trenches, and removing the excess dielectric using a technique such as chemical-mechanical planarization. In another embodiment, STI can variously include the steps of deposition of an oxide and/or a nitride, lithography, dry etch, trench fill (for example, with an oxide), chemical-mechanical polishing of the oxide, removal of the nitride, and/or adjusting the oxide height.

In an embodiment, the device can include a substrate 302. In one embodiment, the substrate 302 can refer to a solid (usually planar) substance onto which a layer of another substance is applied, and to which that second substance adheres. In one embodiment, the substrate can be a thin slice of material such as silicon, silicon oxide, silicon dioxide, aluminum oxide, sapphire, germanium, gallium arsenide (GaAs), an alloy of silicon and germanium, and/or indium phosphide (InP), and the like.

In one embodiment, the device can include a source 304. In one embodiment, the source 304 can include silicon. In another embodiment, the silicon material may be n-doped. In another embodiment, the source 304 can be fabricated using MBE. In another embodiment, the source 304 can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the source material. In one embodiment, the source 304 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the source can include gettering materials. In one embodiment, the gettering materials can getter sulfur. In one embodiment, the source 304 can be doped, for example, by creating vacancies of sulfur and selenium. In one embodiment, the source 304 can be doped with oxygen vacancies if the source comprises an oxide or a multi-material system. In another embodiment, the source can be doped with phosphorous, boron, aluminum, tin, hafnium, titanium, copper, indium, and/or arsenic if the source 304 comprises a non-oxide a single-material semiconductor. In another embodiment, the source 304 can be approximately 1 nanometer to approximately 75 nm thick (in the x or y dimension), with example thicknesses of approximately 20 nm to approximately 30 nm thick (in the x or y dimension). In one embodiment, the source 304 can be deposited using PVD, CVD, MOCVD, MBE, and/or ALD.

In one embodiment, the device can further include a channel 306. In one embodiment, the channel 306 can include silicon. In another embodiment, the channel 306 can include intrinsic silicon. In one embodiment, the channel 306 can be deposited using MBE. In another embodiment, the channel 306 can include black phosphorous, amorphous silicon, germanium, carbon nanotube, and the like. In one embodiment, the channel 306 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In another embodiment, the channel 306 can be approximately 20 nm to approximately 200 nm long (in the y dimension), with example thicknesses of approximately 60 nm to approximately 80 nm long (in the y dimension). In one embodiment, the channel width can depend on which technology was used to generate the transistor. In one embodiment, the channel width can be approximately 200 nm down to approximately 5 nm. In one embodiment, the channel 306 can be deposited using PVD, CVD, MOCVD, MBE, and/or ALD, and the like.

In one embodiment, the device 300 can include a drain 308. In one embodiment, the drain 308 can be deposited using a mask. In another embodiment, the drain 308 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain 308 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain 308 can be doped with oxygen vacancies if the source comprises an oxide or a multi-material system. In another embodiment, the source can be doped with phosphorous, boron, aluminum, tin, hafnium, titanium, copper, indium, and/or arsenic if the drain 308 comprises a non-oxide a single-material semiconductor. In one embodiment, the drain 308 can have a thickness of approximately 0.5 nm to approximately 100 nm (in the x or y dimension), with example thicknesses of approximately 0.5 nm to approximately 20 nm (in the x or y dimension). In one embodiment, the drain 308 can be deposited using PVD, CVD, MOCVD, MBE, and/or ALD, and the like. In one embodiment, the source 304 and drain 308 can include the same material, except that the source 304 can be treated to remove some of the sulfur and/or selenium.

In one embodiment, the device 300 can include an oxide 310. In another embodiment, the oxide 310 can include an interlayer dielectric (ILD) material. In another embodiment, the ILD can include silicon dioxide, $SiO_2$, or a low-K material. In one embodiment, the oxide 310 can be deposited using PVD, CVD, MOCVD, MBE, and/or ALD, and the like. In one embodiment, the oxide 310 can be fabricated as follows: initially, a trench can be etched, for example, using a short trench recess process (STR); next, the trenches can be filled with an oxide material such as the oxide 210 using, for example, PVD, CVD, MOCVD, MBE, and/or ALD, and the like; additionally, the oxide can be polished until the level of the oxide in the z-dimension is flushed with the level of the drain 308, in the z-direction. In one embodiment, the oxide 310 can be approximately 5 nm to approximately 50 nm wide (in the x-dimension). In another embodiment, the oxide 310 can be approximately 10 nm long to approximately 150 nm long (in the y-dimension).

Figure 4A:
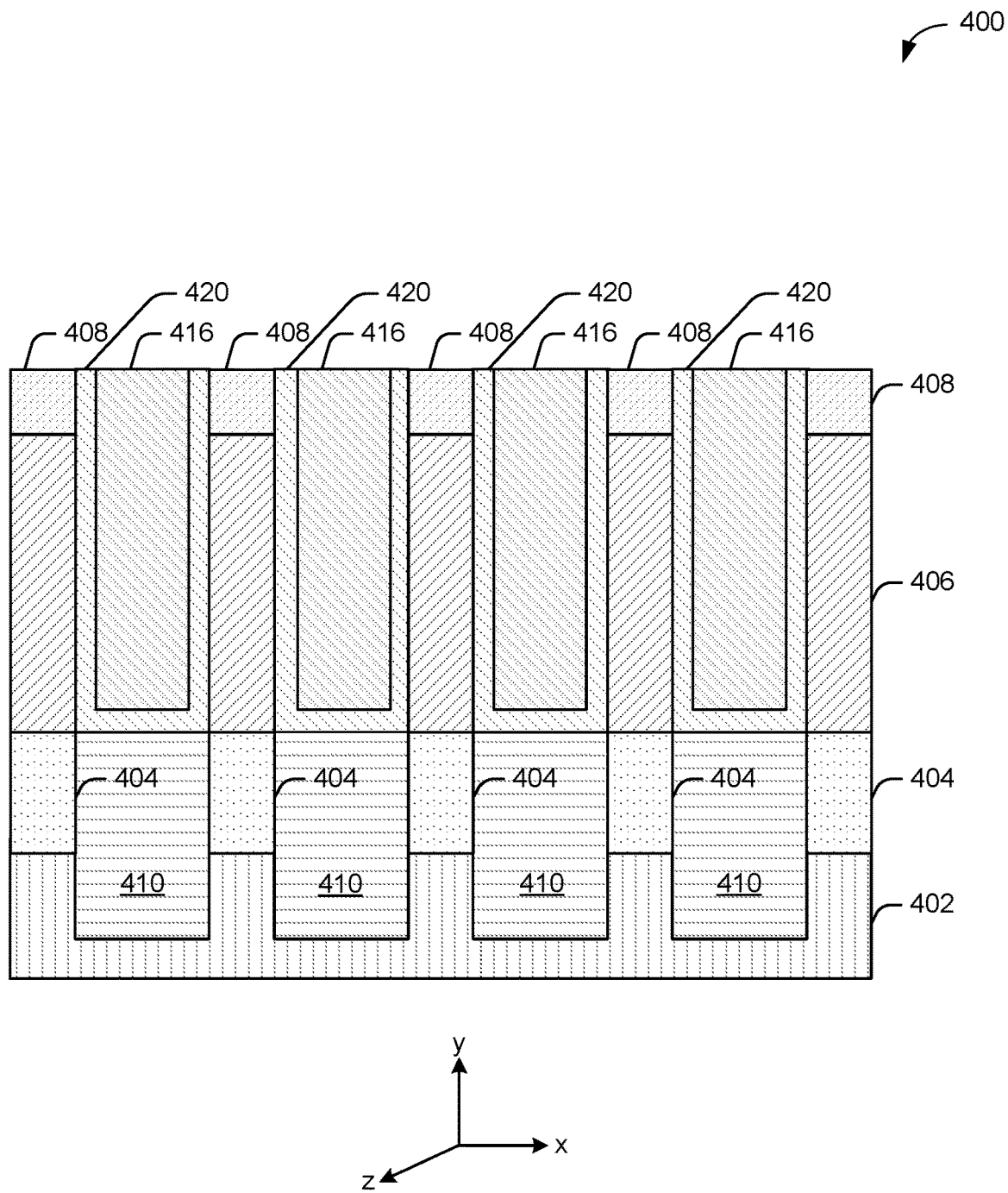
FIG. 4A shows another diagram representing a partial structure in the fabrication of the VFET device, in accordance with one or more example embodiments of the disclosure.

FIG. 4A shows a diagram 400 representing a partial structure of an intermediate step in the fabrication of the vertical FET device, in accordance with one or more example embodiments of the disclosure. In one embodiment, the recesses 314 as shown and described in connection with FIG. 3, can be filled with a gate material 420. In one embodiment, the gate material 420 can be deposited and/or grown on one or more sidewalls associated with the recess 314, for example, on the sidewalls of the drain 408 and/or the channel 406. In one embodiment, the gate material 420 may not be deposited as an independent layer persay, but rather, may grow naturally, for example, as an oxide after the deposition of a metal gate 416, to be discussed further below. In one embodiment, the gate material 420 can include a high-K dielectric material. In another embodiment, the high-K material, for example, hafnium oxide, tantalum oxide, titanium oxide, aluminum oxide, silicon dioxide, silicon nitride and the like. In another embodiment, the gate material 420 can include silicon oxide, which may not be a high-K material. In one embodiment, an electroglass (EG) can be used as the gate material 420. In one embodiment, the gate material 420 can include hydrogenated boron nitride (HBN). In one embodiment, the gate material can be deposited using PVD, CVD, MOCVD, MBE, and/or ALD, and the like. In one embodiment, the gate material 420 can have a width of 0.5 nm to approximately 20 nm (x-dimension). In another embodiment, the gate material 420 can have a thickness of approximately 0.5 nm to approximately 100 nm (in they dimension).

In one embodiment, a gate 416 can be deposited on the gate material 420. In one embodiment, the gate 416 can serve as a wordline in the device. In another embodiment, the gate 416 can include a metal. In another embodiment, the gate 416 can include a transition metal. In one embodiment, the gate 416 can be used to tune the threshold voltage of the device. In one embodiment, gate 416 can include titanium nitride, cobalt, tungsten and/or platinum. In one embodiment, the gate 416 can be deposited using PVD, CVD, MOCVD, MBE and/or ALD, and the like. In one embodiment, the gate 416 can have a width of approximately 10 nm to approximately 150 nm (x-dimension). In another embodiment, the gate 416 can have a length of approximately 10 nm to approximately 150 nm (y-dimension).

In an embodiment, the device can include a substrate 402. In one embodiment, the substrate 402 can refer to a solid (usually planar) substance onto which a layer of another substance is applied, and to which that second substance adheres. In one embodiment, the substrate can be a thin slice of material such as silicon, silicon oxide, silicon dioxide, aluminum oxide, sapphire, germanium, gallium arsenide (GaAs), an alloy of silicon and germanium, and/or indium phosphide (InP), and the like.

In one embodiment, the device can include a source 404. In one embodiment, the source 404 can include silicon. In another embodiment, the silicon material may be n-doped. In another embodiment, the source 404 can be fabricated using MBE. In another embodiment, the source 404 can include doped or undoped black phosphorous, titanium, tantalum, cobalt, molybdenum, titanium nitride, tantalum nitride, hafnium, copper, gadolinium, and the like. In one embodiment, the source 404 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source material. In one embodiment, source can include gettering materials. In one embodiment, the gettering materials can getter sulfur. In one embodiment, the source 404 can be doped, for example, by creating vacancies of sulfur and selenium. In one embodiment, the source 404 can be doped with oxygen vacancies if the source comprises an oxide or a multi-material system. In another embodiment, the source can be doped with phosphorous, boron, aluminum, tin, hafnium, titanium, copper, indium, and/or arsenic if the source 404 comprises a non-oxide a single-material semiconductor. In another embodiment, the source 404 can be approximately 1 nanometer to approximately 75 nm thick (in the x or y dimension), with example thicknesses of approximately 20 nm to approximately 30 nm thick (in the x or y dimension). In one embodiment, the source 404 can be deposited using PVD, CVD, MOCVD, MBE, and/or ALD, and the like.

In one embodiment, the device can further include a channel 406. In one embodiment, the channel 406 can include silicon. In another embodiment, the channel 406 can include intrinsic silicon. In one embodiment, the channel 406 can be deposited using MBE. In another embodiment, the channel 406 can include black phosphorous, amorphous silicon, germanium, carbon nanotube, and the like. In one embodiment, the channel 406 can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the channel width can depend on which technology was used to generate the transistor. In another embodiment, the channel 406 can be approximately 20 nm to approximately 200 nm long (in the y dimension), with example thicknesses of approximately 60 nm to approximately 80 nm long (in the y dimension). In one embodiment, the channel width can be approximately 200 nm down to approximately 5 nm (in the x or y dimension). In one embodiment, the channel 406 can be deposited using PVD, CVD, MOCVD, MBE, and/or ALD, and the like.

In one embodiment, the device can include a drain 408. In one embodiment, the drain 408 can be deposited using a mask. In another embodiment, the drain 408 can include can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain 408 can include silicon, germanium, indium gallium arsenide (InGaAs), gallium nitride (GaN), amorphous semi-conductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain 408 can be doped with oxygen vacancies if the source comprises an oxide or a multi-material system. In another embodiment, the source can be doped with phosphorous, boron, aluminum, tin, hafnium, titanium, copper, indium, and/or arsenic if the drain 408 comprises a non-oxide a single-material semiconductor. In one embodiment, the drain 408 can have a thickness of approximately 0.5 nm to approximately 100 nm (in the x or y dimension), with example thicknesses of approximately 0.5 nm to approximately 20 nm (in the x or y dimension). In one embodiment, the drain 408 can be deposited using PVD, CVD, MOCVD, MBE, and/or ALD, and the like. In one embodiment, the source 404 and drain 408 can include the same material, except that the source 404 can be treated to remove some of the sulfur and/or selenium.

In one embodiment, the device can include an oxide 410. In another embodiment, the oxide 410 can include an ILD material. In another embodiment, the ILD can include silicon dioxide, $SiO_2$, or a low-K material. In one embodiment, the oxide 410 can be deposited using PVD, CVD, MOCVD, and/or ALD, and the like. In one embodiment, the oxide 410 can be fabricated as follows: initially, a trench can be etched, for example, using a short trench recess process (STR); next, the trenches can be filled with an oxide material such as the oxide 410 using, for example, PVD, CVD, MOCVD, and/or ALD, and the like; additionally, the oxide can be polished until the level of the oxide in the z-dimension is flushed with the level of the drain 408 in the z-direction. In one embodiment, the oxide 410 can be approximately 2 nm to approximately 40 nm wide (in the x dimension). In another embodiment, the oxide 410 can be approximately 2 nm long to approximately 40 nm long (in the y-dimension).

Figure 4B:
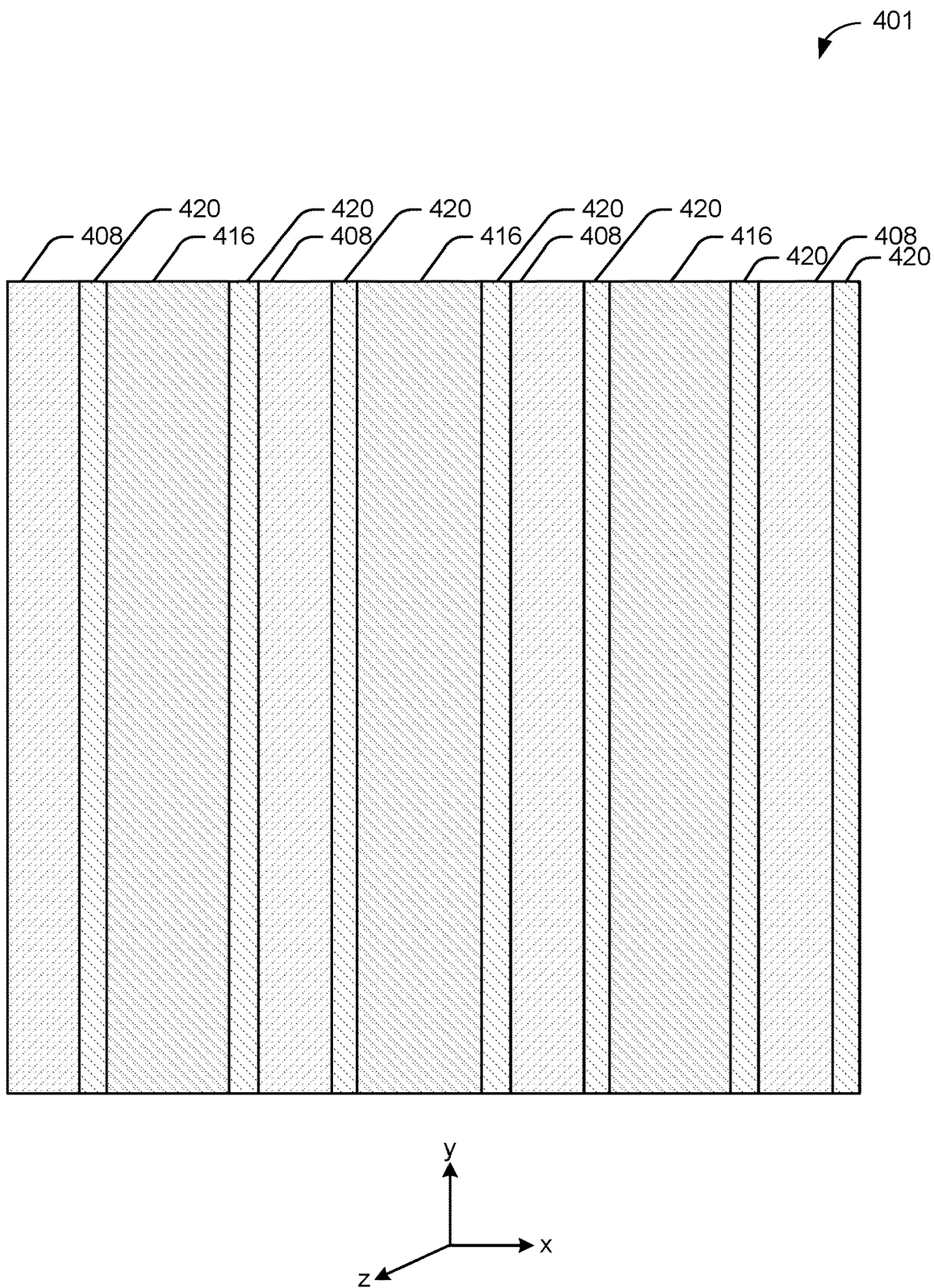
FIG. 4B shows a diagram of a top plan view of a VFET as fabricated in FIG. 4A, in accordance with one or more example embodiments of the disclosure.

FIG. 4B, shows a diagram 401 of a top down view of a vertical FET as fabricated in FIGS. 1-4A, in accordance with one or more example embodiments of the disclosure. In particular, FIG. 4B shows a top down view of the drain 408. In one embodiment, the device can include a drain 408. In another embodiment, the drain 408 can include silicon. In another embodiment, the drain 408 can include an n-doped material, for example, an n-doped silicon. In one embodiment, the drain 408 can be deposited using a mask. In another embodiment, the drain 408 can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain can include gettering materials. In one embodiment, the gettering materials can getter sulfur. In one embodiment, the drain 408 can have a thickness of approximately 0.5 nm to approximately 100 nm (in the x or y dimension), with example thicknesses of approximately 0.5 nm to approximately 20 nm (in the x or y dimension). In one embodiment, the drain 408 can be deposited using PVD, CVD, MOCVD, MBE, and/or ALD, and the like. In one embodiment, the source 404 and drain 408 can include the same material, except that the source 404 can be treated to remove some of the sulfur and/or selenium.

In one embodiment, diagram 401 shows a top down view of the gate material 420. In one embodiment, the gate material 420 can include a high-K dielectric material. In another embodiment, the gate material 420 can include a high-K material, for example, hafnium oxide, tantalum oxide, titanium oxide, aluminum oxide, silicon dioxide, silicon nitride and the like. In another embodiment, the gate material 420 can include silicon oxide, which may not be a high-K material. In one embodiment, an electroglass (EG) can be used as the gate material 420. In one embodiment, the gate material 420 can include hydrogenated boron nitride (HBN). In one embodiment, the gate material can be deposited using PVD, CVD, MOCVD, MBE, and/or ALD, and the like. In one embodiment, the gate material 420 can have a width of 10 nm to approximately 150 nm (x-dimension). In another embodiment, the gate material 420 can have length of approximately 10 nm to approximately 150 nm (y-dimension).

In one embodiment, the diagram 401 shows a top down view of the gate 416. In one embodiment, a gate 416 can be deposited on the gate material 420. In another embodiment, the gate 416 can include a metal. In another embodiment, the gate 416 can include a transition metal. In one embodiment, the gate 416 can be used to tune the threshold voltage of the device. In one embodiment, gate 416 can include titanium nitride, cobalt, tungsten and/or platinum. In one embodiment, the gate 416 can be deposited using PVD, CVD, MOCVD, MBE and/or ALD, and the like. In one embodiment, the gate 416 can have a width of approximately 10 nm to approximately 150 nm (x-dimension). In another embodiment, the gate 416 can have a length of approximately 10 nm to approximately 150 nm (y-dimension).

In one embodiment, wordlines can refer to one or more rows in an array composed of VFETs, that is a VFET array. In another embodiment, the columns in the VFET array can be referred to as bit-lines. In one embodiment, the worldliness can connect the gates of VFETs in a certain row in an array of VFETs. Accordingly, when activating or deactivating a wordline (that is, increasing or decreasing the voltage on or from the wordline), the transistors which are on the row of a given wordline of the array can open or correspondingly close.

In one embodiment, the drain of VFET can comprise an n-doped material, for example, n-doped silicon. In one embodiment, the drain of VFET can be incorporated into the device using, for example, epitaxial growth. In one embodiment, the drain of VFET can be fabricated using MBE. In another embodiment, one or more trenches (also referred to as spacers and/or spacer fins herein) can be fabricated, for example, using an STR process to pattern an oxide layer associated with the VFET. In one embodiment, a hard mask may be used in connection with the fabrication of the trenches and/or spacer fins. In one embodiment, an STI process can be used to fabricate one or more recesses to the drains of the VFETs. In one embodiment, the systems, methods, and apparatus can permit the self-alignment of one or more wordlines of the VFET with the one or more fins and/or subsequent gate metals and gate materials of the VFET. In one embodiment, the one or more wordlines can be independently electrically isolated from one another, without any further patterning and/or alignment steps in the fabrication, thereby permitting and/or facilitating the scaling up of the VFETs.

In one embodiment, the source of the VFET can include silicon. In another embodiment, the silicon material may be n-doped. In another embodiment, the source can be fabricated using MBE. In one embodiment, the VFET can include a channel that can be made of silicon. In another embodiment, the channel can include an intrinsic silicon. In one embodiment, the channel can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like.

In one embodiment, the channel can be deposited using MBE. In one embodiment, the VFET can include a drain. In one embodiment, the drain can be deposited using a mask.

In one embodiment, the drain can include silicon. In another embodiment, the silicon material may be n-doped. In another embodiment, the drain can be fabricated using MBE.

In one embodiment, the device can include an oxide. In another embodiment, the oxide can include an ILD material. In another embodiment, ILD can include silicon dioxide, $SiO_2$, or a low-K material. In one embodiment, the oxide can be deposited using PVD, CVD, MOCVD, and/or ALD, and the like.

In one embodiment, the oxide can be fabricated as follows: initially, a trench (also referred to as a spacer and/or a spacer fin herein) can be etched, for example, using a STR process; next, the trenches can be filled with an oxide material such as the oxide using, for example, PVD, CVD, MOCVD, MBE, and/or ALD, and the like; additionally, the oxide can be polished until the level of the oxide in the z-dimension is made flush with the level of the drain.

In one embodiment, the recesses can be filled with a gate material. In one embodiment, the gate material can include a high-K dielectric material. In another embodiment, the gate material can include a high-K material, for example, hafnium oxide, tantalum oxide, titanium oxide, aluminum oxide, silicon dioxide, silicon nitride and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, and/or ALD, and the like.

In one embodiment, a gate can be deposited on the gate material. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, MBE, and/or ALD, and the like.

Figure 5:
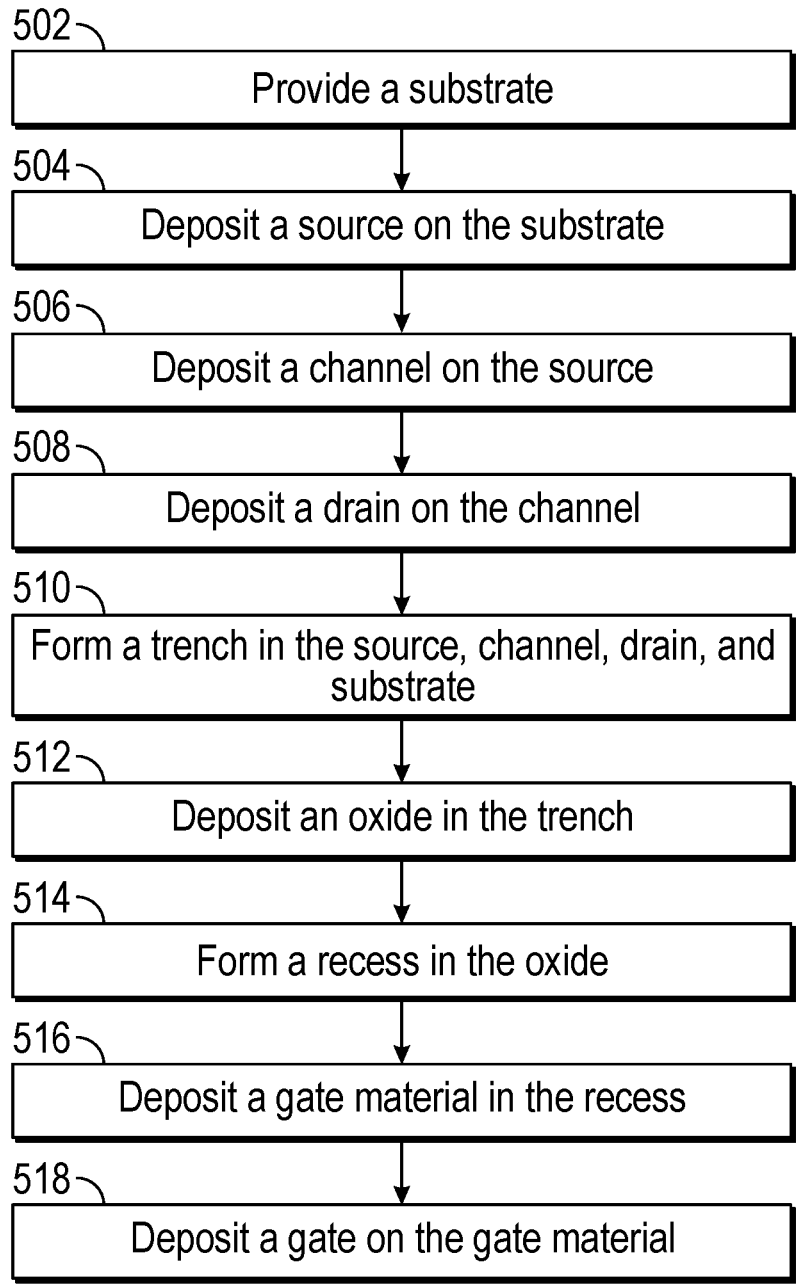
FIG. 5 shows a diagram of an example flow chart for the fabrication of a VFET device, in accordance with example embodiments of the disclosure.

FIG. 5 shows a diagram of an example flow chart for the fabrication of a VFET device, in accordance with example embodiments of the disclosure. In block 502, a substrate can be provided. In one embodiment, the substrate can refer to a solid (usually planar) substance onto which a layer of another substance is applied, and to which that second substance adheres. In one embodiment, the substrate can be a thin slice of material such as silicon, silicon oxide, silicon dioxide, aluminum oxide, sapphire, germanium, gallium arsenide (GaAs), an alloy of silicon and germanium, and/or indium phosphide (InP), and the like.

In block 504, a source can be deposited on the substrate. In one embodiment, the device can include a source. In one embodiment, the source can include silicon. In another embodiment, the silicon material may be n-doped. In another embodiment, the source can be fabricated using MBE. In one embodiment, the source can include doped or undoped black phosphorous, titanium, tantalum, cobalt, molybdenum, titanium nitride, tantalum nitride, hafnium, copper, gadolinium, and the like. In one embodiment, the source can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source material. In one embodiment, source can include gettering materials. In one embodiment, the gettering materials can getter sulfur. In one embodiment, the source can be doped, for example, by creating vacancies of sulfur and selenium. In one embodiment, the source can be doped with oxygen vacancies if the source comprises an oxide or a multi-material system. In another embodiment, the source can be doped with phosphorous, boron, aluminum, tin, hafnium, titanium, copper, indium, and/or arsenic if the source comprises a non-oxide a single-material semiconductor. In another embodiment, the source can be approximately 1 nanometer to approximately 75 nm thick (in the x or y dimension), with example thicknesses of approximately 20 nm to approximately 30 nm thick (in the x or y dimension). In one embodiment, the source can be deposited using PVD, CVD, MOCVD, MBE, and/or ALD, and the like.

In block 506, a channel can be deposited on the source. In one embodiment, the channel can include silicon. In another embodiment, the channel can include intrinsic silicon. In one embodiment, the channel can be deposited using MBE. In another embodiment, the channel can include black phosphorous, amorphous silicon, germanium, carbon nanotube, and the like. In one embodiment, the channel can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In another embodiment, the channel can be approximately 20 nm to approximately 200 nm thick (in the y dimension), with example thicknesses of approximately 60 nm to approximately 80 nm thick (in the y dimension). In one embodiment, the channel width can depend on the technology used to generate the transistor. In one embodiment, the channel width can be approximately 200 nm down to approximately 5 nm (in the x dimension). In one embodiment, the channel can be deposited using PVD, CVD, MOCVD, MBE, and/or ALD, and the like.

In block 508, a drain can be deposited on the channel. In one embodiment, the drain can be deposited using a mask. In another embodiment, the drain can include doped or undoped black phosphorous, titanium, tantalum, cobalt, molybdenum, titanium nitride, tantalum nitride, hafnium, copper, gadolinium, and the like. In one embodiment, the doping can include generating electron vacancies in the drain material. In one embodiment, the drain can include silicon, germanium, indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the drain can include gettering materials. In one embodiment, the gettering materials can getter sulfur. In one embodiment, the drain can be doped with oxygen vacancies if the source comprises an oxide or a multi-material system. In another embodiment, the source can be doped with phosphorous, boron, aluminum, tin, hafnium, titanium, copper, indium, and/or arsenic if the drain comprises a non-oxide a single-material semiconductor. In one embodiment, the drain can have a thickness of approximately 0.5 nm to approximately 100 nm (in the x or y dimension), with example thicknesses of approximately 0.5 nm to approximately 20 nm (in the x or y dimension). In one embodiment, the drain 408 can be deposited using PVD, CVD, MOCVD, MBE and/or ALD, and the like. In one embodiment, the source and drain can include the same material, except that the source can be treated to remove some of the sulfur and/or selenium.

In block 510, a trench can be formed in the source, channel, drain, and substrate. In one embodiment, the trench can be etched, for example, using a short trench recess process (STR).

In block 512, an oxide can be deposited in the trench. In one embodiment, the device can include an oxide. In another embodiment, the oxide can include an ILD material. In another embodiment, the ILD can include silicon dioxide, SiO$_2$, or a low-K material. In one embodiment, the oxide can be deposited using PVD, CVD, MOCVD, MBE and/or ALD, and the like. Additionally, the oxide can be polished until the level of the oxide in the z-dimension is flushed with the level of the drain, in the z-direction. In one embodiment, the oxide can be approximately 0 nm to approximately 200 nm wide (in the x-dimension). In another embodiment, the oxide can be approximately 0 nm long to approximately 200 nm long (in the y-dimension).

In block 514, a recess can be formed in the oxide.

In one embodiment, a STI process can be used to etch the oxide described in block 512 above to yield a recess. In another embodiment, the recess can have a width of approximately 10 nm to approximately 150 nm (x-dimension). In another embodiment, the recesses 314 can have a length of approximately 10 nm to approximately 150 nm (y-dimension). In one embodiment, the recess can be slightly over-etched in the y-dimension with respect to the level of the source.

In block 516, a gate material can be deposited in the recess. In one embodiment, the recesses can be filled with a gate material. In one embodiment, the gate material can include a high-K dielectric material. In another embodiment, the gate material can include a high-K material, for example, hafnium oxide, tantalum oxide, and/or titanium oxide, and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, MBE, and/or ALD and the like. In one embodiment, the gate material can have a width of 0.5 nm to approximately 20 nm (x-dimension). In another embodiment, the gate material can have a thickness of approximately 0.5 nm to approximately 100 nm (in the y dimension).

In block 518, a gate can be deposited on the gate material. In one embodiment, a gate can be deposited on the gate material. In another embodiment, the gate can include a metal. In another embodiment, the gate can include a transition metal. In one embodiment, the gate can be used to tune the threshold voltage of the device. In one embodiment, the gate can include titanium nitride, cobalt, tungsten and/or platinum. In one embodiment, the gate can be deposited using PVD, CVD, MOCVD, MBE, and/or ALD, and the like. In one embodiment, the gate can have a width of approximately 10 nm to approximately 200 nm (x-dimension). In another embodiment, the gate can have a length of approximately 10 nm to approximately 200 nm (y-dimension).

In one embodiment, wordlines can refer to one or more rows in VFET array, whereas the columns in the VFET array can be referred to as bit-lines. In one embodiment, the worldliness can connect the gates of VFETs in a certain row in an array of VFETs. Thus, when activating or deactivating a wordline (that is, increasing or decreasing the voltage on or from it), the transistors which are on the row of a given wordline of the array can open or correspondingly close.

In one embodiment, the drain of VFET can comprise an n+ doped material, for example, n+ doped silicon. In one embodiment, the drain of VFET can be incorporated into the device using, for example, epitaxial growth. In one embodiment, the drain of VFET can be fabricated using molecular beam epitaxy (MBE). In another embodiment, one or more trenches (also referred to as spacers and/or spacer fins herein) can be fabricated, for example, using an short trench recess process (STR) process to pattern an oxide layer associated with the VFET. In one embodiment, a hard mask may be used in connection with the fabrication of the trenches and/or spacer fins. In one embodiment, an STI process can be used to fabricate one or more recesses to the drains of the VFETs. In one embodiment, the systems, methods, and apparatus can permit the self-alignment of one or more wordlines of the VFET with the one or more fins and/or subsequent gate metals and gate materials of the VFET. In one embodiment, the one or more wordlines can be independently electrically isolated from one another, without any further patterning and/or alignment steps in the fabrication, thereby permitting and/or facilitating the scaling up of the VFETs.

In one embodiment, the source of the VFET can include silicon. In another embodiment, the silicon material may be n-doped. In another embodiment, the source can be fabricated using MBE. In one embodiment, the VFET can include a channel that can be made of silicon. In another embodiment, the channel can include an intrinsic silicon. In one embodiment, the channel can be deposited using MBE. In one embodiment, the VFET can include a drain. In one embodiment, the drain can be deposited using a mask. In one embodiment, the drain can include silicon. In another embodiment, the silicon material may be n-doped. In another embodiment, the drain can be fabricated using MBE. In one embodiment, the device can include an oxide 210. In another embodiment, the oxide can include an interlayer dielectric (ILD) material. In another embodiment, ILD can include silicon dioxide, SiO$_2$, or a low-K material. In one embodiment, the oxide can be deposited using PVD, CVD, MOCVD, and/or ALD, and the like.

In one embodiment, the oxide can be fabricated as follows: initially, a trench (also referred to as a spacer and/or a spacer fin herein) can be etched, for example, using a short trench recess process (STR); next, the trenches can be filled with an oxide material such as the oxide using, for example, PVD, CVD, MOCVD, and/or ALD, and the like; additionally, the oxide can be polished until the level of the oxide in the z-dimension is flushed with the level of the drain.

In one embodiment, the recesses can be filled with a gate material. In one embodiment, the gate material can include a high-K dielectric material. In another embodiment, the gate material can include a high-K material, for example, hafnium oxide, tantalum oxide, titanium oxide, aluminum oxide, silicon dioxide, silicon nitride and the like. In another embodiment, the gate material can include silicon oxide, which may not be a high-K material. In one embodiment, an electroglass (EG) can be used as the gate material. In one embodiment, the gate material can include hydrogenated boron nitride (HBN). In one embodiment, the gate material can be deposited using PVD, CVD, MOCVD, MBE and/or ALD, and the like.

In one embodiment, a gate can be deposited on the gate material. In another embodiment, the gate can include a metal. In another embodiment, the gate can include a transition metal. In one embodiment, the gate can be used to tune the threshold voltage of the device. In one embodiment, gate can include titanium nitride, cobalt, tungsten and/or platinum. In one embodiment, the gate can be deposited using PVD, CVD, MOCVD, and/or ALD.

Figure 6:
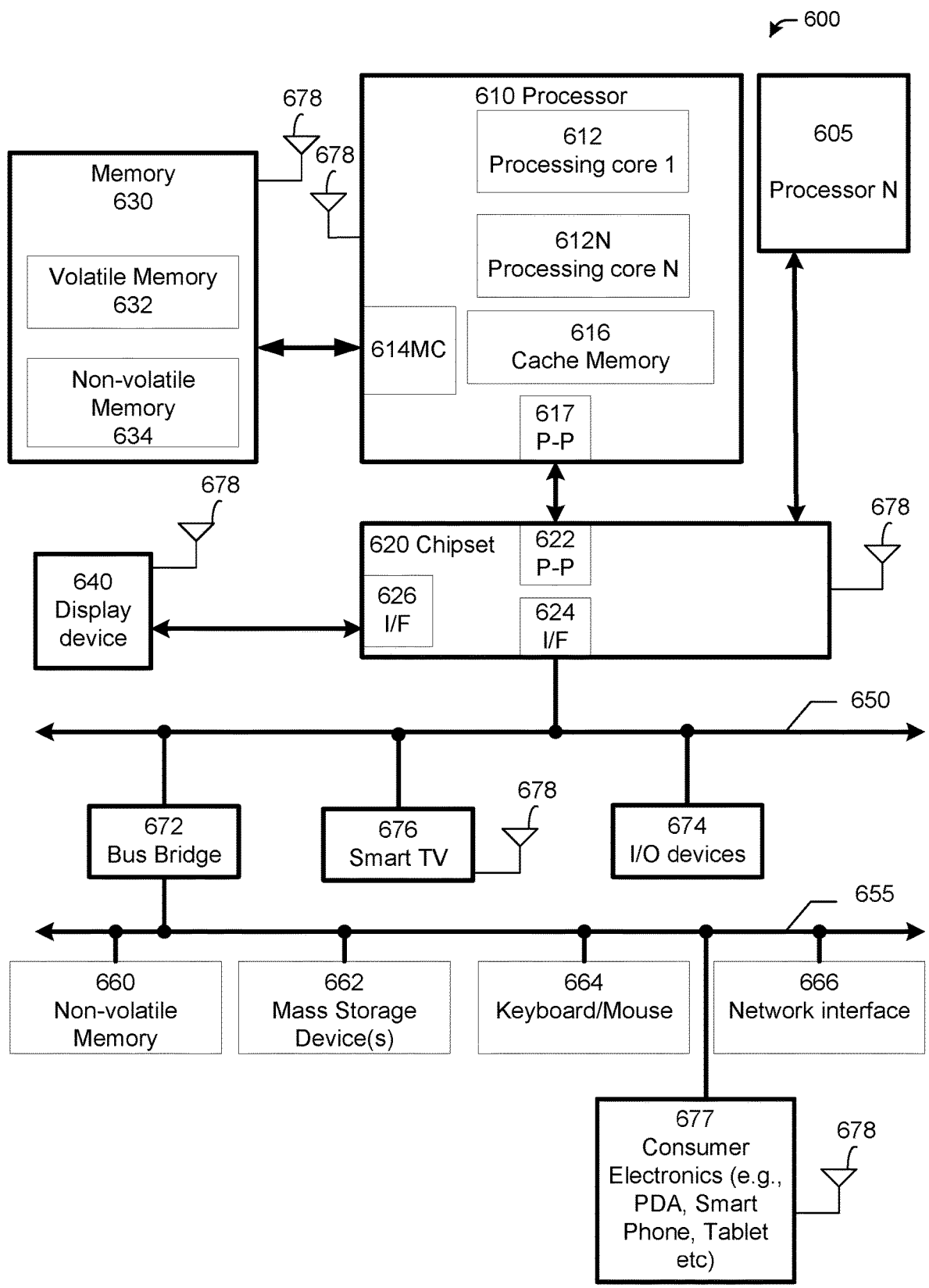
FIG. 6 depicts an example of a system according to one or more embodiments of the disclosure.

FIG. 6 depicts an example of a system 600 according to one or more embodiments of the disclosure. In one embodiment, the VFETs shown and described herein can be used in connection with the system 600 shown in FIG. 6. For example, the VFETs can be used in and serve as parts of any number of the devices depicted and described (below) in connection with FIG. 6. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 can include a system on a chip (SOC) system.

In one embodiment, system 600 includes multiple processors including processor 610 and processor N 605, where processor N 605 has logic similar or identical to the logic of processor 610. In one embodiment, processor 610 has one or more processing cores (represented here by processing core 1 612 and processing core N 612N, where 612N represents the Nth processor core inside processor 610, where N is a positive integer). More processing cores can be present (but not depicted in the diagram of FIG. 6). In some embodiments, processing core 612 includes, but is not limited to, pre-fetch logic to fetch instructions, decode logic to decode the instructions, execution logic to execute instructions, a combination thereof, or the like. In some embodiments, processor 610 has a cache memory 616 to cache instructions and/or data for system 600. Cache memory 616 may be organized into a hierarchical structure including one or more levels of cache memory.

In some embodiments, processor 610 includes a memory controller (MC) 614, which is configured to perform functions that enable the processor 610 to access and communicate with memory 630 that includes a volatile memory 632 and/or a non-volatile memory 634. In some embodiments, processor 610 can be coupled with memory 630 and chipset 620. Processor 610 may also be coupled to a wireless antenna 678 to communicate with any device configured to transmit and/or receive wireless signals.

In one embodiment, the wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol. In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory device 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interface 617 and P-P interface 622. Chipset 620 enables processor 610 to connect to other elements in system 600. In some embodiments of the disclosure, P-P interface 617 and P-P interface 622 can operate in accordance with a PtP communication protocol, such as the Intel® QuickPath Interconnect (QPI) or the like. In other embodiments, a different interconnect may be used.

In some embodiments, chipset 620 can be configured to communicate with processor 610, the processor N 605, display device 640, and other devices 672, 676, 674, 660, 662, 664, 666, 677, etc. Chipset 620 may also be coupled to the wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the disclosure, processor 610 and chipset 620 are integrated into a single SOC. In addition, chipset 620 connects to bus 650 and/or bus 655 that interconnect various elements 674, 660, 662, 664, and 666. Bus 650 and bus 655 may be interconnected via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device(s) 662 can include, but not be limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a Universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 or selected elements thereof can be incorporated into processor core 612.

It is noted that the system 600 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-6), as disclosed herein, may be provided in any variety of electronic device including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 is a method, comprising: providing a substrate; depositing a source on the substrate; depositing a channel on the source; depositing a drain on the channel; forming a trench in the source, channel, drain, and substrate; depositing an oxide in the trench; depositing a gate material in the trench at least on the oxide; and depositing a gate on the gate material. In example 2, the method of example 1 can optionally include depositing the gate material in the trench at least on the oxide further comprises forming a recess in the trench by removing at least a portion of the oxide. In example 3, the method of any one of examples 1-2 can optionally include depositing the gate material in the trench at least on the oxide further comprises depositing the gate material on one or more surfaces of the trench defined by the drain and the channel. In example 4, the method of any one of examples 1-3 can optionally include at least one of depositing the source, depositing the channel, or depositing the drain comprises deposition using molecular beam epitaxy. In example 5, the method of any one of examples 1-4 can optionally include depositing the channel comprises depositing an intrinsic silicon material. In example 6, the method of any one of examples 1-5 can optionally include depositing the source or depositing the drain comprises depositing an n-doped silicon material. In example 7, the method of any one of examples 1-6 can optionally include forming the trench comprises forming the trench using a short trench recess process. In example 8, the method of any one of examples 1-7 can optionally include forming the recess comprises forming the recess using a shallow trench isolation process. In example 9, the method of any one of claims 1-8 can optionally include depositing the gate material comprises depositing a high-K dielectric material. In example 10, the method of any one of examples 1-9 can optionally include depositing the gate material comprises depositing at least one of a high-K dielectric material, the high-K dielectric material further comprising hafnium oxide, tantalum oxide, titanium oxide, aluminum oxide, silicon dioxide, or silicon nitride. In example 11, the method of any one of examples 1-10 can optionally include depositing the gate comprising depositing a transition metal. In example 12, the method of any one of examples 1-11 can optionally include depositing the gate comprises depositing at least one of a transition metal further comprising titanium nitride, cobalt, tungsten or platinum.

Example 13 is a vertical field-effect transistor device, comprising: a substrate; a source disposed on the substrate; a channel disposed on the source; a drain disposed on the channel; an elongated trench extending through and defined by the source, channel, drain, and substrate; oxide deposited in the trench and at least partially filling the trench; a gate material deposited on the oxide in the trench; and a gate on the gate material. In example 14, the device of example 13 can optionally include the source comprising an n-doped silicon material. In example 15, the device of any one of examples 13-14 can optionally include the channel comprising an intrinsic silicon material. In example 16, the device of any one of examples 13-15 can optionally include the drain comprising an n-doped silicon material. In example 17, the device of any one of examples 13-16 can optionally include the gate material comprising a high-K dielectric material. In example 18, the device of any one of examples 13-17 can optionally include the gate material comprising a high-K dielectric material, the high-K dielectric material further comprising hafnium oxide, tantalum oxide, or titanium oxide, aluminum oxide, silicon dioxide, or silicon nitride. In example 19, the device of any one of examples 13-18 can optionally include the gate comprising a transition metal. In example 20, the device of any one of examples 13-19 can optionally include the gate comprising a transition metal further comprising titanium nitride, cobalt, tungsten or platinum.

Example 21 is a system, comprising: a memory; and at least one processor in communication with the memory, the at least one processor including: a vertical field-effect transistor device, the vertical field-effect transistor device further comprising: a substrate; a source on the substrate; a channel on the source; a drain on the channel; an oxide in a trench in the source, channel, drain, and substrate; a gate material in the recess in the oxide; and a gate on the gate material. In example 22, the system of example 21 can optionally include the source comprising an n-doped silicon material. In example 23, the system of any one of examples 21-22 can optionally include the channel comprising an intrinsic silicon material. In example 24, the system of any one of examples 21-23 can optionally include the gate material comprising a high-K dielectric material. In example 25, the system of any one of examples 21-24 can optionally include the gate material comprising a high-K dielectric material, the high-K dielectric material further comprising hafnium oxide, tantalum oxide, titanium oxide, aluminum oxide, silicon dioxide, or silicon nitride. In example 26, the system of any one of examples 21-25 can optionally include the drain comprising an n-doped silicon material. In example 27, the system of any one of examples 21-26 can optionally include the gate comprising a transition metal. In example 28, the system of any one of examples 21-27 can optionally include the gate comprising a transition metal further comprising titanium nitride, cobalt, tungsten or platinum.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claims are as follows:

1. A method for fabricating a vertical field effect transistor, the method comprising:
   providing a substrate;
   depositing a source material on the substrate;
   depositing a channel material on the source material;
   depositing a drain material on the channel material;
   forming a first trench and a second trench through the source, channel, and drain materials, the first trench substantially parallel to the second trench and spaced apart by a single fin comprising the source, channel, and drain materials;
   depositing an oxide into a bottom portion of the first trench and a bottom portion of the second trench;
   depositing a gate dielectric material in the first trench, over the oxide, adjacent to a first side of the fin, and adjacent to a second side of the fin;
   depositing a gate material in the first trench and in the second trench, and adjacent to the gate dielectric material; and
   planarizing the gate material within the first trench and second trench with the fin.

2. The method of claim 1, further comprising forming a recess in the first trench and the second trench by removing at least a portion of the oxide before depositing the gate dielectric material.

3. The method of claim 1, wherein depositing the gate material in the trench at least the oxide further comprises depositing the gate dielectric material on one or more surfaces of the first trench and the second trench defined by the drain and the channel.

4. The method of claim 1, wherein at least one of depositing the source material, depositing the channel material, or depositing the drain material comprises molecular beam epitaxy.

5. The method of claim 1, wherein depositing the channel material comprises depositing intrinsic silicon material.

6. The method of claim 1, wherein depositing the source material or depositing the drain material comprises depositing n-type silicon material.

7. The method of claim 1, wherein forming the first trench and second trench comprises etching completely through the source material.

8. The method of claim 1, wherein planarizing the gate material further comprises planarizing the gate dielectric material with the drain material.

9. The method of claim 1, wherein depositing the gate dielectric material comprises depositing a high-K dielectric material, and wherein planarizing the gate material further comprises planarizing the gate dielectric material with the fin.

10. The method of claim 9, wherein depositing the gate dielectric material comprises depositing a material comprising oxygen and at least one of hafnium, tantalum, titanium, aluminum, silicon, or nitrogen.

11. The method of claim 1, wherein depositing the gate material comprises depositing a transition metal.

12. The method of claim 1, wherein depositing the gate material comprises depositing at least one of titanium, cobalt, tungsten, or platinum.

13. A vertical field-effect transistor device, comprising:
   a substrate;
   a source material on the substrate;
   a channel material on the source material;
   a drain material on the channel material;
   a first trench and a second trench extending through the source, channel, and drain materials, wherein the first trench is substantially parallel to the second trench and spaced apart by a single fin comprising the source, channel, and drain materials;
   an oxide in a bottom portion of the first trench and a bottom portion of the second trench;
   a gate dielectric material over the oxide in the first trench and the second trench, the gate dielectric adjacent to a first side of the fin and adjacent to a second side of the fin; and a gate material in the first trench and in the second trench, the gate material adjacent to the gate dielectric material that is adjacent to the first and second sides of the fin.

14. The vertical field-effect transistor device of claim 13, wherein the source material comprises n-type silicon material.

15. The vertical field-effect transistor device of claim 13, wherein the channel material comprises intrinsic silicon material.

16. The vertical field-effect transistor device of claim 13, wherein the drain material comprises n-type silicon material.

17. The vertical field-effect transistor device of claim 13, wherein the gate dielectric material comprises a high-K dielectric material.

18. The vertical field-effect transistor device of claim 13, wherein the gate dielectric material comprises oxygen and at least one of hafnium, tantalum, titanium, aluminum, silicon, or nitrogen.

19. The vertical field-effect transistor device of claim 13, wherein the gate material comprises a transition metal.

20. The vertical field-effect transistor device of claim 13, wherein the gate material comprises at least one of titanium, cobalt, tungsten, or platinum.

21. A system comprising:
a memory; and
at least one processor in communication with the memory, the at least one processor including:
a vertical field-effect transistor device, the vertical field-effect transistor device further comprising:
a substrate;
a source material on the substrate;
a channel material on the source material;
a drain material on the channel material;
a first trench and a second trench extending through the source, channel, and drain materials, wherein the first trench is substantially parallel to the second trench and spaced apart by a single fin comprising the source, channel, and drain materials;
an oxide in a bottom portion of the first trench and a bottom portion of the second trench;
a gate dielectric material over the oxide in the first trench and the second trench, the gate dielectric adjacent to a first side of the fin and adjacent to a second side of the fin; and
a gate material in the first trench and in the second trench, the gate material adjacent to the gate dielectric material that is adjacent to the first and second sides of the fin.

22. The system of claim 21, wherein the source material comprises n-type silicon material.

23. The system of claim 21, wherein the channel material comprises intrinsic silicon material.

24. The system of claim 21, wherein the gate dielectric material comprises a high-K dielectric material.

25. The system of claim 21, wherein the gate dielectric material comprises oxygen and at least one of hafnium, tantalum, titanium, aluminum, silicon, or nitrogen.

* * * * *